United States Patent
Hao et al.

(10) Patent No.: US 10,054,637 B2
(45) Date of Patent: Aug. 21, 2018

(54) TESTING MULTI-CORE INTEGRATED CIRCUIT WITH PARALLEL SCAN TEST DATA INPUTS AND OUTPUTS

(71) Applicant: FREESCALE SEMICONDUCTOR, INC., Austin, TX (US)

(72) Inventors: Zhiyong Hao, Shanghai (CN); Yuliang Zhou, Hangzhou (CN); Yongfeng Zhu, Shanghai (CN)

(73) Assignee: NXP USA, INC., Austin, TX (US)

( * ) Notice: Subject to any disclaimer, the term of this patent is extended or adjusted under 35 U.S.C. 154(b) by 143 days.

(21) Appl. No.: 15/254,993

(22) Filed: Sep. 1, 2016

(65) Prior Publication Data

US 2017/0131351 A1    May 11, 2017

(30) Foreign Application Priority Data

Nov. 11, 2015   (CN) .......................... 2015 1 1035978

(51) Int. Cl.
| | | |
|---|---|---|
| *G01R 31/28* | (2006.01) | |
| *G01R 31/3177* | (2006.01) | |
| *G01R 31/317* | (2006.01) | |
| *G01R 31/3185* | (2006.01) | |

(52) U.S. Cl.
CPC ... *G01R 31/3177* (2013.01); *G01R 31/31703* (2013.01); *G01R 31/31713* (2013.01); *G01R 31/31723* (2013.01); *G01R 31/318561* (2013.01); *G01R 31/318563* (2013.01); *G01R 31/318572* (2013.01)

(58) Field of Classification Search
CPC .... G01R 31/318555; G01R 31/318572; G01R 31/318541; G01R 31/318536; H05K 999/99
USPC ....................................................... 714/727
See application file for complete search history.

(56) References Cited

U.S. PATENT DOCUMENTS

| | | | |
|---|---|---|---|
| 5,732,209 A | 3/1998 | Vigil et al. | |
| 7,263,642 B1 | 8/2007 | Makar | |
| 7,653,849 B1 * | 1/2010 | Tabatabaei | G01R 31/318508 714/726 |

(Continued)

OTHER PUBLICATIONS

Chris Allsup, Padmashree Takkars, Teresa McLaurin, "DFTMAX Compression Shared I/O—Minimize the Cost of Testing ARM® Processor-Based Designs and Other Multicore SoCs", AP.CS5142, Synopsys, Inc., Nov. 2014.

*Primary Examiner* — Albert Decady
*Assistant Examiner* — Enam Ahmed
(74) *Attorney, Agent, or Firm* — Charles E. Bergere

(57) ABSTRACT

Testing an integrated circuit (IC) that has a set of nominally similar cores and pairs of test data input (TDI) and test data output (TDO) pads common to the different cores. Similar scan chains in parallel in the different cores provide response signals as functions of corresponding TDI signals. Respective combined TDO signals are provided to the TDO pads. In the absence of a defect, the combined TDO signals are asserted and de-asserted like the response signals from corresponding chains in the different cores and like corresponding expected response signals. The combined TDO signals are different from the corresponding expected response signals in the presence of a defect in at least one of the cores. If the result is a fail, the ATE may identify a defective core using a diagnosis module in the IC providing response signals from a selected core.

11 Claims, 2 Drawing Sheets

(56) References Cited

U.S. PATENT DOCUMENTS

| | | |
|---|---|---|
| 8,607,107 B2 | 12/2013 | Cheng |
| 8,856,602 B2 | 10/2014 | Brown |
| 2003/0204802 A1 | 10/2003 | Sim |
| 2005/0204217 A1 | 9/2005 | Whetsel |
| 2009/0013226 A1* | 1/2009 | Swoboda ....... G01R 31/318536 714/726 |
| 2009/0089636 A1 | 4/2009 | Fernsler |
| 2013/0080748 A1* | 3/2013 | Moyer ................ G06F 11/3656 712/227 |
| 2017/0193154 A1* | 7/2017 | Sul ................ G01R 31/318314 |

* cited by examiner

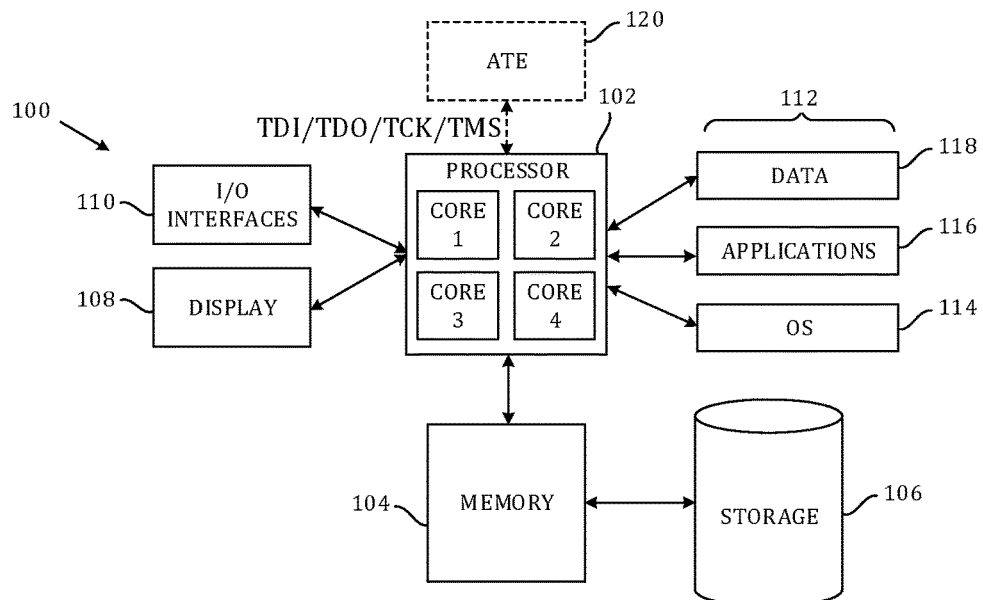
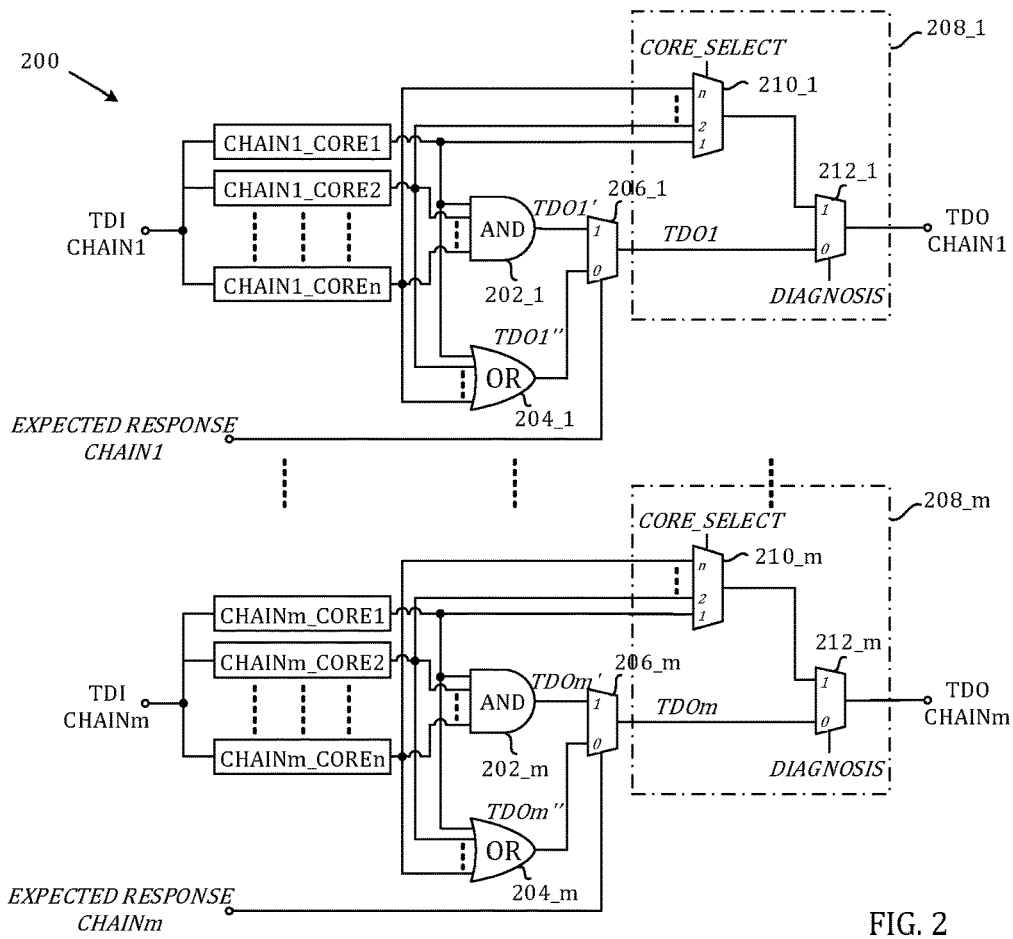
FIG. 1
(PRIOR ART)
FIG. 2

TESTING MULTI-CORE INTEGRATED CIRCUIT WITH PARALLEL SCAN TEST DATA INPUTS AND OUTPUTS

BACKGROUND

The present invention is directed to multi-core integrated circuits and, more particularly, to testing a multi-core integrated circuit with parallel scan test data inputs and outputs.

Integrated circuits (ICs) are commonly tested using automatic test equipment (ATE) during manufacture to detect hardware defects. A device under test (DUT) may have design-for-testability (DFT) features that facilitate the automatic testing. The DFT features often include scan test capability in which elements of the IC, such as latches or flip-flops, are connected temporarily in scan chains to test the functionality of the elements. Test data input signals are applied to a test data input (TDI) pads to shift test patterns into the IC through the scan chains during test mode operation. The DUT is returned to functional operation during one or more capture clock cycles, and the resulting signals are shifted out through the scan chains to test data output (TDO) pads and checked against expected valid outputs. One industry standard that is widely used in automatic testing of ICs (and other circuits) is the Joint Test Action Group (JTAG) standard IEEE 1149.1 Standard Test Access Port and Boundary-Scan Architecture.

Multi-core ICs have more than one core that ensure given circuit functions, such as central processor cores (CPU), digital signal processors (DSP), Serializer/Deserializers (SerDes), phase-locked loops (PLLs), digital-to-analog converters (DAC), analog-to-digital converters (ADC) and physical layer units (PHYs). Scan testing such multi-core ICs commonly involves testing several cores that are each configured in test mode with a plurality of scan chains. A conventional approach provides m TDI and m TDO pads for m chains for each core, and a total of 2*m*n TDI and TDO pads for n cores. However, it is important to reduce the number of connection pads, and therefore the number of external pins or leads on ICs, especially for some types of devices. Another conventional approach uses only m TDI and m TDO pads, common to all the cores, but applies the test data to the cores one after the other, which multiplies the test time by the number n of cores.

Cores of a multi-core IC of the same type commonly have nominally similar functional characteristics, and are tested by similar TDI test patterns shifted through similar scan chains in the cores. Another conventional approach provides m common TDI pads for m similar chains in each of the nominally similar cores and applies the TDI signals simultaneously to the corresponding chains in all the cores in parallel. This approach avoids increasing the test time. However, there are still respective TDO pads for each chain and each core, so that there are a total of m*(n+1) TDI and TDO pads for n cores.

It would be advantageous to scan test nominally similar cores of a multi-core IC simultaneously, in parallel using common scan TDI pads and common scan TDO pads.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

FIG. 1 is a schematic block diagram of a multi-core integrated circuit in which the present invention can be implemented;

FIG. 2 is a schematic block diagram of a multi-core integrated circuit in accordance with an embodiment of the invention.

DETAILED DESCRIPTION

Figure 3:
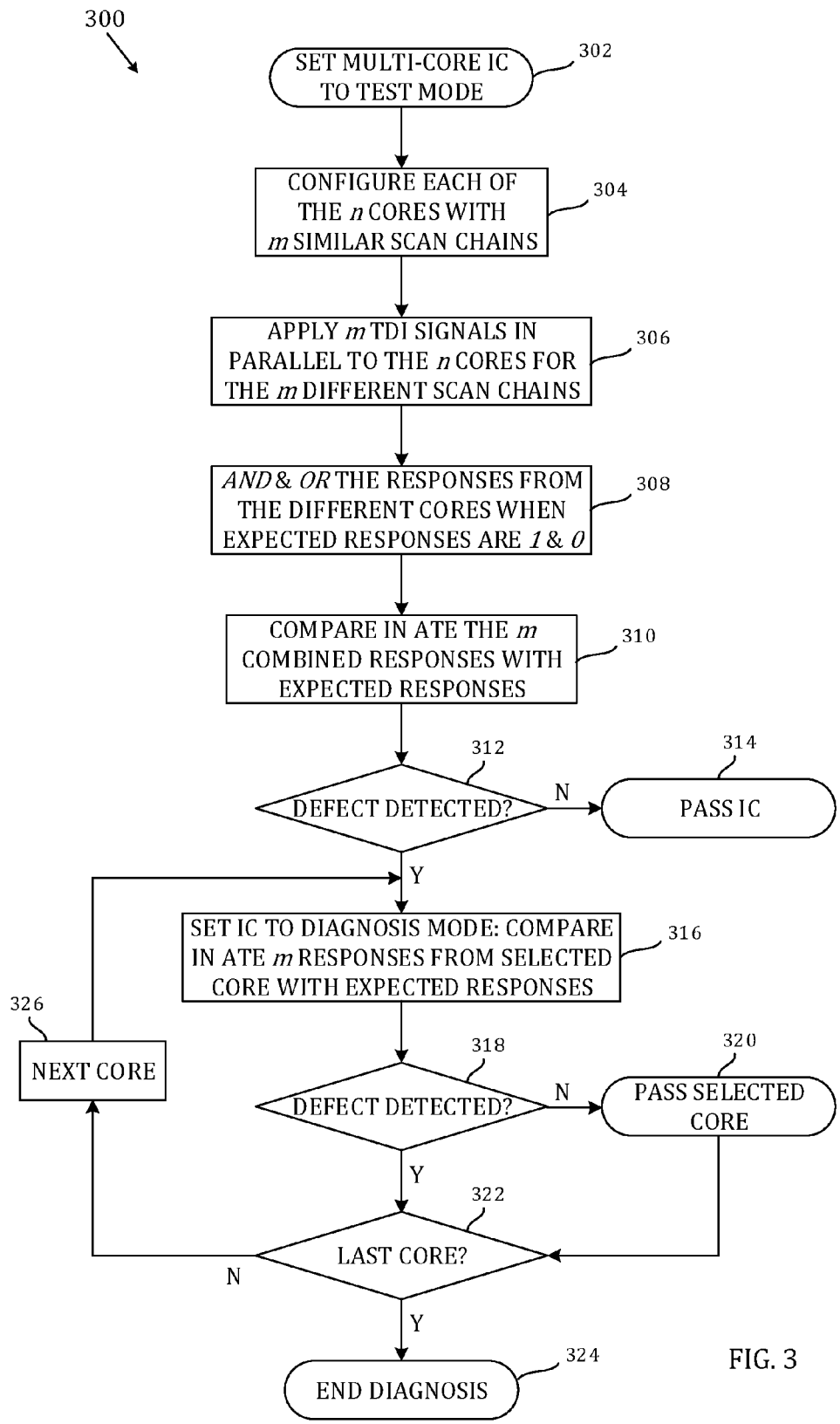
FIG. 3 is a flow chart of a method of testing a multi-core integrated circuit in accordance with an embodiment of the invention.

FIG. 1 illustrates an integrated circuit (IC) 100 in which the present invention can be implemented and that can be tested by the methods of the present invention. The IC 100 includes a multi-core processor 102 having processor cores 1, 2, 3 and 4 coupled to a memory 104 and additional memory or storage 106 coupled to the memory 104. The IC 100 also includes a display device output 108, input/output interfaces 110, and software 112. The software 112 includes operating system software 114, applications programs 116, and data 118. The IC 100 generally is known in the art except for the adaptations that enable it to be tested by the methods of the present invention when coupled to automatic test equipment (ATE) 120. When software or a program is executing on the processor 102, the processor becomes a "means-for" performing the steps or instructions of the software or application code running on the processor 102. That is, for different instructions and different data associated with the instructions, the internal circuitry of the processor 102 takes on different states due to different register values, and so on, as is known by those of skill in the art. Thus, any means-for structures described herein relate to the processor 102 as it performs the steps of the methods disclosed herein.

FIG. 2 illustrates a multi-core IC 200 in accordance with an embodiment of the present invention. The IC 200 comprises a set of nominally similar cores CORE1 to COREn. Four cores are shown in the IC 200 but the IC may have a different number of cores. It will be appreciated that nominally similar cores have nominally similar functional characteristics, but may have differences due to manufacturing tolerances. In particular, a defective core will be different from cores which are not defective.

The IC 200 also comprises pairs of test data input pads TDI CHAIN1 to TDI CHAINm and test data output pads TDO CHAIN1 to TDO CHAINm, and corresponding expected response input pads EXPECTED RESPONSE CHAIN1 to EXPECTED RESPONSE CHAINm, that are common to the different cores CORE1 to COREn of the set. The cores CORE1 to COREn are each configurable in a test mode with a plurality of scan chains CHAIN1 to CHAINm, wherein similar scan chains in the different cores CORE1 to COREn are connected in common to respective TDI pads TDI CHAIN1 to TDI CHAINm and provide response signals CHAIN1_CORE1 to CHAINm_COREn from the different cores as functions of corresponding TDI signals TDI1 to TDIm applied to the respective common TDI pads. Respective conjunction modules 202_1, 204_1, 206_1 to 202_m, 204_m, 206_m for the different scan chains CHAIN1 to CHAINm provide to the TDO pads TDO CHAIN1 to TDO CHAINm respective combined TDO signals TDO1 to TDOm that in the absence of defect are asserted and de-asserted like the response signals CHAIN1_CORE1 to CHAINm_COREn from corresponding chains in the different cores CORE1 to COREn and like expected response signals applied to the expected response input pads EXPECTED RESPONSE CHAIN1 to EXPECTED RESPONSE CHAINm for the corresponding scan chains CHAIN1 to CHAINm. The combined TDO signals TDO1 to TDOm are asserted and de-asserted differently from the expected response signals for the corresponding scan chains CHAIN1 to CHAINm in the presence of a defect in at least one of the cores CORE1 to COREn.

The combined TDO signals TDO1 to TDOm are received in the ATE 120. If there is no defect, since the individual cores CORE1 to COREn are nominally similar, the combined TDO signals TDO1 to TDOm are identical to the individual responses of the different cores. The comparison with the expected response signals, which are also applied to the input pads EXPECTED RESPONSE CHAIN1 to EXPECTED RESPONSE CHAINm, enable the ATE 120 to pass this test for all the cores CORE1 to COREn of the IC 200 in parallel. The duration of the test if the result is a pass is equivalent to conventional approaches having a total of 2*m*n TDI and TDO pads for n cores and m chains for each core, or (n+1)*m TDI and TDO pads if the TDI pads for the different cores are shared for the corresponding scan chains. However, the test of the present invention only requires 3 m test pads in the IC 200, including the TDI and TDO pads and the input pads for the expected response signals. The saving in test pads can be used for test time reduction, by increasing the number of different scan chains and reducing the scan chain length. Alternatively, the test pads saved for the multi-core testing in the IC 200 can be allocated to testing other modules in the IC simultaneously. The number of test pads does not increase with the number n of cores in the IC, so that the saving of test pads is greater the more cores there are in the IC 200. ICs commonly have four, eight or more cores, and the number of cores in future ICs is likely to increase.

The cores CORE1 to COREn are nominally similar and have the same manufacturing processes and hardening. If a core is defective, it is relatively frequent that all the cores CORE1 to COREn are defective at certain process, voltage, temperature conditions (PVT corners). It is not sufficient therefore to test the IC by comparing only the test results from the cores CORE1 to COREn with one another. However, with the present invention the combined TDO signals TDO1 to TDOm are available to the ATE 120, which compares them with the expected response signals in detail and stores the results of the comparison in a failure log, useful in diagnosing the defects and identifying the defective core or cores. Although the individual response signals CHAIN1_CORE1 to CHAINm_COREn from the cores CORE1 to COREn are processed through the conjunction modules 202_1, 204_1, 206_1 to 202_m, 204_m, 206_m before being output from the test data output pads TDO CHAIN1 to TDO CHAINm, the combined TDO signals TDO1 to TDOm that are output are still test response data instead of PASS or FAIL information. Outputting to the ATE 120 test response data instead of PASS/FAIL data output has advantages in that the scan test response patterns captured by the ATE 120, and the failure log which ATE 120 derives, can be directly used for scan diagnosis. In addition, from the unchanged scan test response patterns, the ATE 120 has all information needed to mask certain test channels and cycles if desired, without the masking having to be performed in the IC 200.

The IC 200 may include diagnosis modules 208_1 to 208_m for use in identifying a defective core CORE1 to COREn. The diagnosis module 208 provides response signals CHAIN1_COREx to CHAINm_COREx from a selected core COREx to the TDO pads TDO CHAIN1 to TDO CHAINm when a diagnosis mode is actuated. The diagnosis module 208 may provide to the TDO pads TDO CHAIN1 to TDO CHAINm the response signals CHAIN1_COREx to CHAINm_COREx from the selected core COREx in the diagnosis mode, and provide to the TDO pads TDO CHAIN1 to TDO CHAINm the combined TDO signals TDO1 to TDOm from the conjunction modules 202_1, 204_1, 206_1 to 202_m, 204_m, 206_m when the diagnosis mode is de-actuated. The majority of ICs have no defect. Only if a defect is detected is it necessary to prolong the test mode with the diagnosis mode. Accordingly, the test mode is not usually prolonged by the diagnosis mode. The original scan pattern TDI signals loaded in the test mode can be shifted into the scan chains in the selected core COREx and used also in the diagnosis mode. The changes from the test mode for the diagnosis mode can be provided by only the value of a signal DIAGNOSIS to select the diagnosis mode instead of the test mode, and the values of CORE_SELECT signals to select a core or cores to test one by one, known as one-hot diagnosis format.

The diagnosis modules 208_1 to 208_m may comprise respective core select multiplexers 210_1 to 210_m selecting the response signals CHAIN1_COREx to CHAINm_COREx from a selected core COREx for each corresponding chain CHAIN1 to CHAINm as a function of the signal $CORE_{13}$ SELECT. The diagnosis modules 208_1 to 208_m may also comprise respective diagnosis select multiplexers 212_1 to 212_m selecting for each corresponding chain CHAIN1 to CHAINm the outputs from the multiplexers 206_1 to 206_m in the test mode or the outputs from the multiplexers 210_1 to 210_m in the diagnosis mode as a function of the signal DIAGNOSIS. The signals CORE_SELECT and DIAGNOSIS may be provided by the ATE 120 on available pads that are used for other purposes in functional mode, or as user bits from an IEEE1149.1 Test access port (TAP) controller, or any internal resource which can be configured or constrained in scan mode such as registers, flash bits.

The conjunction modules 202_1, 204_1, 206_1 to 202_m, 204_m, 206_m for the different scan chains CHAIN1 to CHAINm may comprise respective first and second conjunction modules 202_1 to 202_m and 204_1 to 204_m. The first conjunction modules 202_1 to 202_m for the different scan chains CHAIN1 to CHAINm provide to the TDO pads TDO CHAIN1 to TDO CHAINm respective first combined TDO signals TDO1' to TDOm' that in the absence of defect are asserted like the response signals CHAIN1_CORE1 to CHAINm_COREn from the corresponding chains in the different cores CORE1 to COREn and like expected response signals applied to the expected response input pads EXPECTED RESPONSE CHAIN1 to EXPECTED RESPONSE CHAINm for the corresponding scan chains CHAIN1 to CHAINm. The second conjunction modules 204_1 to 204_m for the different scan chains CHAIN1 to CHAINm provide to the TDO pads TDO CHAIN1 to TDO CHAINm respective second combined TDO signals TDO1" to TDOm" that in the absence of defect are de-asserted like the response signals from the corresponding chains CHAIN1_CORE1 to CHAINm_COREn in the different cores CORE1 to COREn and like the expected response signals for the corresponding scan chains CHAIN1 to CHAINm.

The first conjunction modules 202_1 to 202_m may include respective AND gates for each chain CHAIN1 to CHAINm receiving the response signals from the cores CORE1 to COREn of the set, and the second conjunction modules 204_1 to 204_m may include respective OR gates for each chain CHAIN1 to CHAINm receiving the response signals CHAIN1_CORE1 to CHAINm_COREn from the cores of the set. For each chain the first or second combined TDO signals TDO1' to TDOm' or TDO1" to TDOm" are selected for the TDO pads as a function of the expected response signals for the corresponding scan chains CHAIN1 to CHAINm being asserted or de-asserted. The conjunction modules for the different scan chains CHAIN1 to CHAINm may comprise respective multiplexers 206_1 to 206_m controlled as a function of assertion and de-assertion of the expected response signals for the corresponding scan chains CHAIN1 to CHAINm. The multiplexers 206_1 to 206_m select the first or second combined TDO signals TDO1' to TDOm' or TDO1" to TDOm" and provide the selected combined TDO signals to the corresponding TDO pads TDO CHAIN1 to TDO CHAINm.

FIG. 3 illustrates a method 300 of testing a multi-core IC such as 200 having a set of nominally similar cores CORE1 to COREn and pairs of test data input pads TDI CHAIN1 to TDI CHAINm and test data output pads TDO CHAIN1 to TDO CHAINm that are common to the different cores. The method 300 comprises setting the IC to a test mode at 302. At 304 each of the cores CORE1 to COREn of the set are configured in a test mode with a plurality of scan chains CHAIN1 to CHAINm. Similar scan chains in the different cores CORE1 to COREn are connected in common to respective TDI pads TDI CHAIN1 to TDI CHAINm and provide response signals CHAIN1_CORE1 to CHAINm_COREn from the different cores as functions of corresponding TDI signals TDI1 to TDIm applied to the respective common TDI pads at 306. At 308, respective combined TDO signals TDO1 to TDOm are provided to the TDO pads TDO CHAIN1 to TDO CHAINm. In the absence of defect, the combined TDO signals TDO1 to TDOm are asserted and de-asserted like the response signals CHAIN1_CORE1 to CHAINm_COREn from corresponding chains in the different cores CORE1 to COREn and like expected response signals applied to the expected response input pads EXPECTED RESPONSE CHAIN1 to EXPECTED RESPONSE CHAINm for the corresponding scan chains CHAIN1 to CHAINm. The combined TDO signals TDO1 to TDOm are asserted and de-asserted differently from the expected response signals for the corresponding scan chains CHAIN1 to CHAINm in the presence of a defect in at least one of the cores CORE1 to COREn.

Automatic test equipment (ATE) 120 may provide the TDI signals and the expected response signals. The ATE 120 may compare the combined TDO signals TDO1 to TDOm with the corresponding expected response signals at 310. A decision is taken at 312 whether the result of the comparison is a pass or fail for the IC. If the result is a pass, the test ends at 314.

If the result of the comparison is a fail, at 316 the ATE 120 may perform a diagnosis process on the IC for use in identifying a defective core in a case where the ATE 120 detects a difference between the combined TDO signals TDO1 to TDOm and the corresponding expected response signals. The diagnosis process may include a diagnosis module 208 in the IC providing response signals CHAIN1_COREx to CHAINM_COREx from a selected core COREx to the TDO pads TDO CHAIN1 to TDO CHAINm, and the ATE 120 comparing the response signals from the selected core with the corresponding expected response signals.

The diagnosis process may be iterated at steps 318 to 326 for each of the cores to identify which of them are defective and to identify the possibilities for rework, for example by eliminating defective cores and down-grading the IC to function with a reduced number of cores.

The invention may be implemented partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A multi-core integrated circuit, comprising:
a set of nominally similar cores;
pairs of test data input (TDI) and test data output (TDO) pads, and corresponding expected response input pads, that are common to the different cores of the set;
wherein the cores are each configurable in a test mode with a plurality of scan chains, wherein similar scan chains in the different cores are connected in common to respective TDI pads and provide response signals from the different cores as functions of corresponding TDI signals applied to the respective common TDI pads;
respective conjunction modules for the different scan chains providing to the TDO pads respective combined TDO signals that in the absence of a defect are asserted and de-asserted like the response signals from corresponding chains in the different cores and like expected response signals applied to the expected response input pads for the corresponding scan chains; and
wherein the combined TDO signals are asserted and de-asserted differently from the expected response signals for the corresponding scan chains in the presence of a defect in at least one of the cores.

2. The integrated circuit of claim 1, further comprising:
a diagnosis module for use in identifying a defective core, and that provides response signals from a selected core to the TDO pads when a diagnosis mode is actuated.

3. The integrated circuit of claim 2, wherein the diagnosis module provides to the TDO pads the response signals from the selected core in the diagnosis mode, and provides to the TDO pads the combined TDO signals from the conjunction modules when the diagnosis mode is de-actuated.

4. The integrated circuit of claim 3, wherein the diagnosis module comprises respective core select multiplexers selecting the response signals from a selected core for each corresponding chain as a function of a core select signal, and respective diagnosis select multiplexers selecting for each corresponding chain the outputs from the core select multiplexers in the test mode or the outputs from the diagnosis select multiplexers in the diagnosis mode as a function of a diagnosis signal.

5. The integrated circuit of claim 1, wherein the conjunction modules for the different scan chains comprise respective first and second conjunction modules, wherein the first conjunction modules for the different scan chains provide to the TDO pads respective first combined TDO signals that in the absence of defect are asserted like the response signals from the corresponding chains in the different cores and like expected response signals applied to the expected response input pads for the corresponding scan chains, and wherein the second conjunction modules for the different scan chains provide to the TDO pads respective second combined TDO signals that in the absence of defect are de-asserted like the response signals from corresponding chains in the different cores and like the expected response signals for the corresponding scan chains.

6. The integrated circuit of claim 5, wherein the first conjunction modules include respective AND gates for each chain receiving the response signals from the cores of the set, and the second conjunction modules include respective OR gates for each chain receiving the response signals from the cores of the set, and wherein for each chain the first or second combined TDO signals are selected for the TDO pads as a function of the expected response signals for the corresponding scan chains being asserted or de-asserted.

7. The integrated circuit of claim 6, wherein the conjunction modules for the different scan chains comprise respective multiplexers controlled as a function of assertion and de-assertion of the expected response signals for the corresponding scan chains, wherein the multiplexers select the first or second combined TDO signals and provide the selected combined TDO signals to the corresponding TDO pads.

8. A multi-core integrated circuit comprising:
a set of nominally similar cores;
pairs of test data input (TDI) and test data output (TDO) pads, and corresponding expected response input pads, that are common to the different cores of the set;
wherein the cores are each configurable in a test mode with a plurality of scan chains, wherein similar scan chains in the different cores are connected in common to respective TDI pads and provide response signals from the different cores as functions of corresponding TDI signals applied to the respective common TDI pads;
respective first conjunction modules for the different scan chains providing to the TDO pads respective first combined TDO signals that in the absence of defect are asserted like the response signals from corresponding chains in the different cores and like expected response signals applied to the expected response input pads for the corresponding scan chains; and respective second conjunction modules for the different scan chains providing to the TDO pads respective second combined TDO signals that in the absence of defect are de-asserted like the response signals from the corresponding chains in the different cores and like the expected response signals for the corresponding scan chains; and wherein the combined TDO signals are asserted and de-asserted differently from the expected response signals for the corresponding scan chains in the presence of a defect in at least one of the cores.

9. The integrated circuit of claim 8, further comprising:
a diagnosis module for use in identifying a defective core, and that provides response signals from a selected core to the TDO pads when a diagnosis mode is actuated.

10. The integrated circuit of claim 8, wherein the first conjunction modules include respective AND gates for each chain receiving the response signals from the cores of the set, and the second conjunction modules include respective OR gates for each chain receiving the response signals from the cores of the set, and wherein for each chain the first or second combined TDO signals are selected for the TDO pads as a function of the expected response signals for the corresponding scan chains being asserted or de-asserted.

11. The integrated circuit of claim 10, further comprising:
multiplexers controlled as a function of assertion and de-assertion of the expected response signals for the corresponding scan chains and that select the first or second combined TDO signals and provide the selected combined TDO signals to the corresponding TDO pads.

* * * * *